United States Patent [19]
Fimoff et al.

[11] Patent Number: 5,940,863
[45] Date of Patent: Aug. 17, 1999

[54] APPARATUS FOR DE-ROTATING AND DE-INTERLEAVING DATA INCLUDING PLURAL MEMORY DEVICES AND PLURAL MODULO MEMORY ADDRESS GENERATORS

[75] Inventors: Mark Fimoff, Hoffman Estates; Lawrence C. Spaete, Jr., Buffalo Grove, both of Ill.

[73] Assignee: Zenith Electronics Corporation, Glenview, Ill.

[21] Appl. No.: 08/687,866

[22] Filed: Jul. 26, 1996

[51] Int. Cl.⁶ .......................... G06F 12/00; H04N 7/015
[52] U.S. Cl. ..................... 711/157; 711/220; 341/81; 348/426; 348/390; 375/340
[58] Field of Search ................... 711/157, 220, 711/217, 218, 219; 375/340, 341; 348/426, 441, 390; 341/50, 81

[56] References Cited

U.S. PATENT DOCUMENTS 5,369,652  11/1994  Bailey et al. .......................... 371/40.1
5,537,420  7/1996  Huang ...................................... 371/2.2

FOREIGN PATENT DOCUMENTS 9518494  7/1995  WIPO .

OTHER PUBLICATIONS

ATSC Digital Television Standard, Annex D, Sep. 16, 1995, Sections 4.1–4.2.5, pp. 48–56.

*Primary Examiner*—Glenn Gossage

[57] ABSTRACT

An apparatus for re-rotating and deinterleaving data includes (i) a first memory for storing D elements of rotated and interleaved data in D storage locations, (ii) a first addresser for addressing the first memory in order to read de-rotated and interleaved data out of the D storage locations and to write rotated and interleaved data into the D storage locations, (iii) a second memory for storing mD elements of the de-rotated and interleaved data read out of the first memory, wherein the de-rotated and interleaved data read out of the first memory are stored in mD storage locations of the second memory, and (iv) a second addresser for addressing the second memory in order to read de-rotated and de-interleaved data out of the mD storage locations and to write de-rotated and interleaved data from the first memory into the mD storage locations. The first addresser may include an address counter, an offset generator, and a modulo adder. The second addresser may include a counter, a seed generator, and a modulo converter.

45 Claims, 10 Drawing Sheets

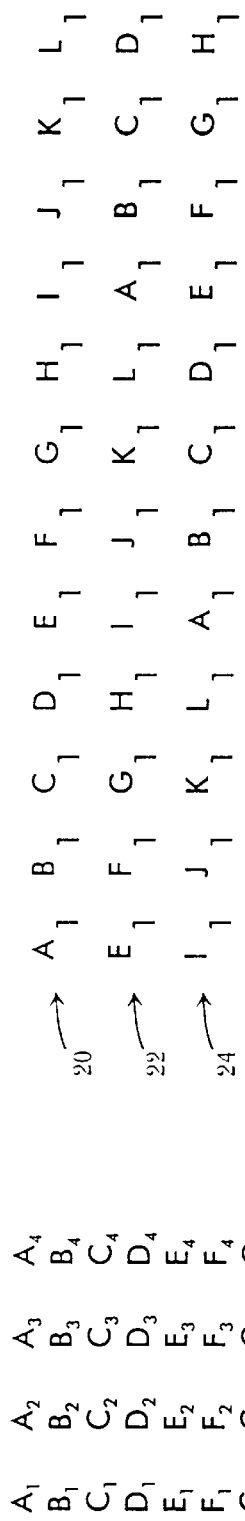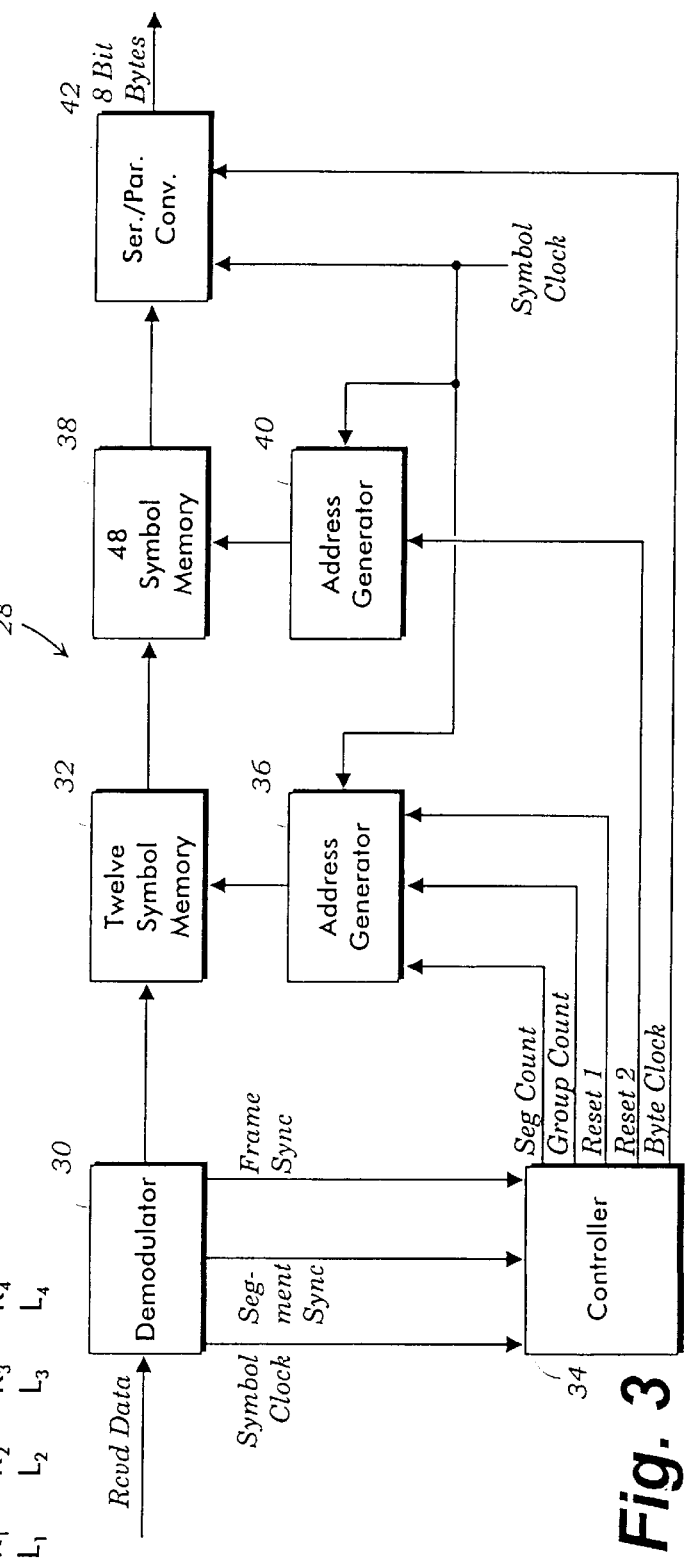
Fig. 1
Fig. 2
Fig. 3

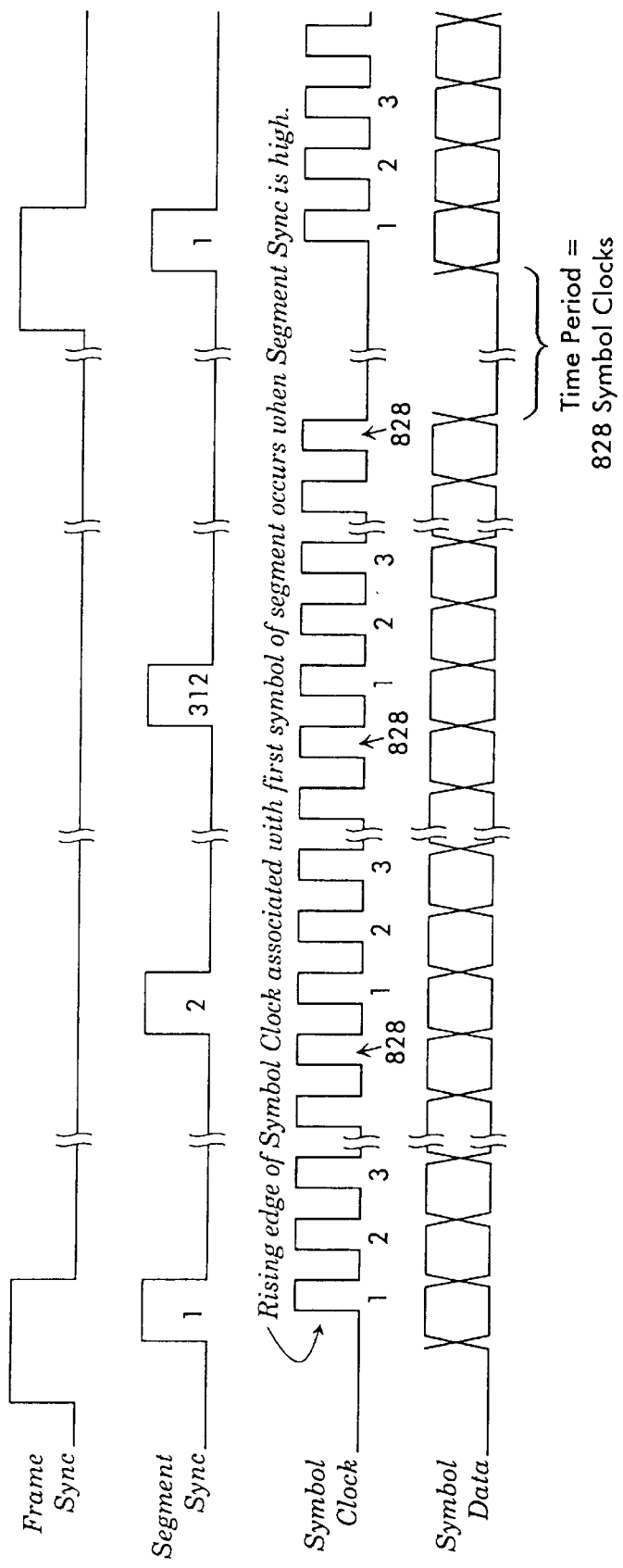

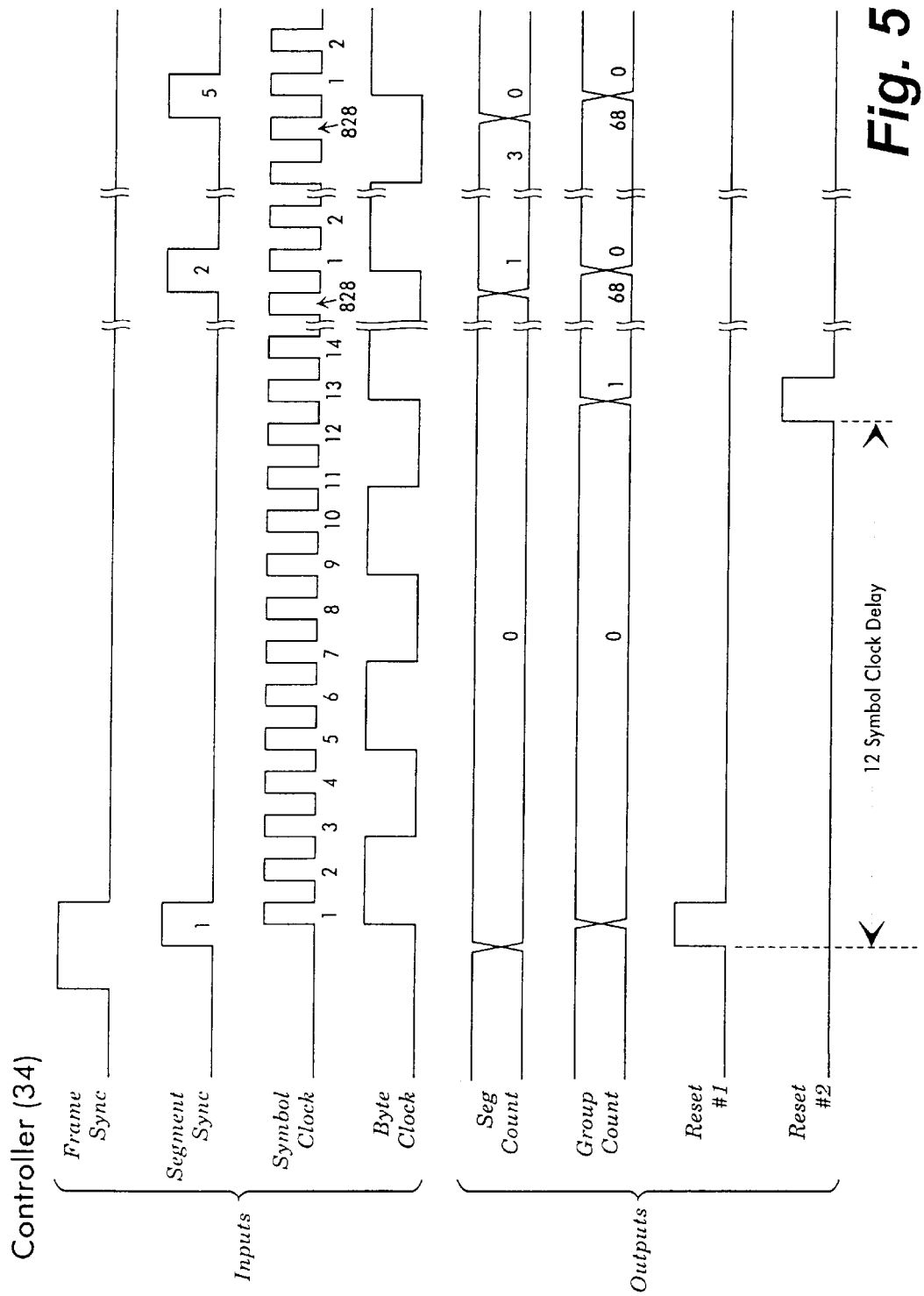

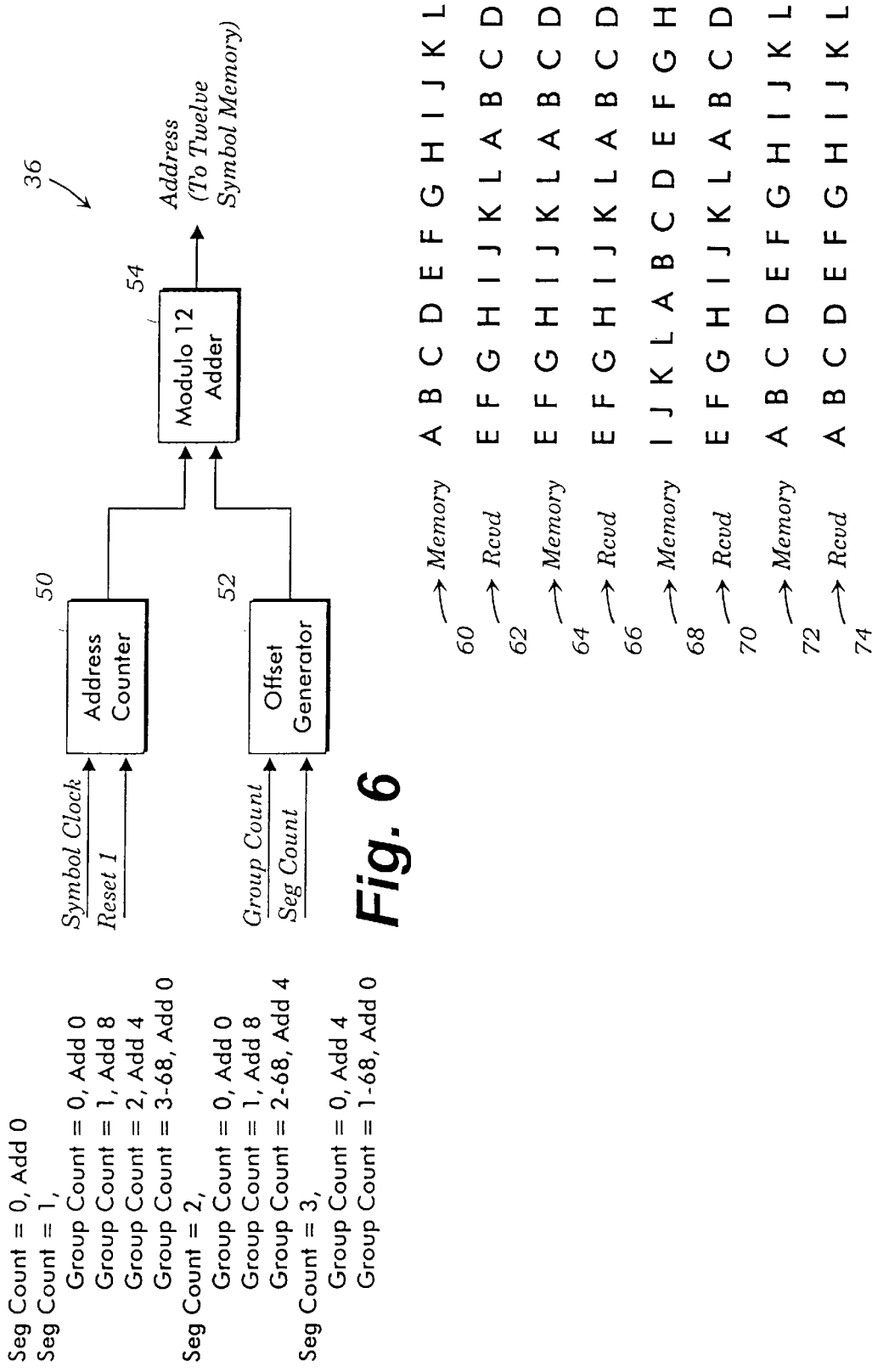

23 Address Sequences Generated by Address Gen. 40

1st Sequence → ... 23rd Sequence →

| | | | | | | | | | | | | | | | | | | | | | | | |
|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 12 | 3 | 36 | 9 | 14 | 27 | 42 | 34 | 32 | 8 | 2 | 24 | 6 | 25 | 18 | 28 | 7 | 37 | 21 | 17 | 16 | 4 | 1 |
| 2 | 24 | 6 | 25 | 18 | 28 | 7 | 37 | 21 | 17 | 16 | 4 | 1 | 12 | 3 | 36 | 9 | 14 | 27 | 42 | 34 | 32 | 8 | 2 |
| 3 | 36 | 9 | 14 | 27 | 42 | 34 | 32 | 8 | 2 | 24 | 6 | 25 | 18 | 28 | 7 | 37 | 21 | 17 | 16 | 4 | 1 | 12 | 3 |
| 4 | 1 | 12 | 3 | 36 | 9 | 14 | 27 | 42 | 34 | 32 | 8 | 2 | 24 | 6 | 25 | 18 | 28 | 7 | 37 | 21 | 17 | 16 | 4 |
| 5 | 13 | 15 | 39 | 45 | 23 | 41 | 22 | 29 | 19 | 40 | 10 | 26 | 30 | 31 | 43 | 46 | 35 | 44 | 11 | 38 | 33 | 20 | 5 |
| 6 | 25 | 18 | 28 | 7 | 37 | 21 | 17 | 16 | 4 | 1 | 12 | 3 | 36 | 9 | 14 | 27 | 42 | 34 | 32 | 8 | 2 | 24 | 6 |
| 7 | 37 | 21 | 17 | 16 | 4 | 1 | 12 | 3 | 36 | 9 | 14 | 27 | 42 | 34 | 32 | 8 | 2 | 24 | 6 | 25 | 18 | 28 | 7 |
| 8 | 2 | 24 | 6 | 25 | 18 | 28 | 7 | 37 | 21 | 17 | 16 | 4 | 1 | 12 | 3 | 36 | 9 | 14 | 27 | 42 | 34 | 32 | 8 |
| 9 | 14 | 27 | 42 | 34 | 32 | 8 | 2 | 24 | 6 | 25 | 18 | 28 | 7 | 37 | 21 | 17 | 16 | 4 | 1 | 12 | 3 | 36 | 9 |
| 10 | 26 | 30 | 31 | 43 | 46 | 35 | 44 | 11 | 38 | 33 | 20 | 5 | 13 | 15 | 39 | 45 | 23 | 41 | 22 | 29 | 19 | 40 | 10 |
| 11 | 38 | 33 | 20 | 5 | 13 | 15 | 39 | 45 | 23 | 41 | 22 | 29 | 19 | 40 | 10 | 26 | 30 | 31 | 43 | 46 | 35 | 44 | 11 |
| 12 | 3 | 36 | 9 | 14 | 27 | 42 | 34 | 32 | 8 | 2 | 24 | 6 | 25 | 18 | 28 | 7 | 37 | 21 | 17 | 16 | 4 | 1 | 12 |
| 13 | 15 | 39 | 45 | 23 | 41 | 22 | 29 | 19 | 40 | 10 | 26 | 30 | 31 | 43 | 46 | 35 | 44 | 11 | 38 | 33 | 20 | 5 | 13 |
| 14 | 27 | 42 | 34 | 32 | 8 | 2 | 24 | 6 | 25 | 18 | 28 | 7 | 37 | 21 | 17 | 16 | 4 | 1 | 12 | 3 | 36 | 9 | 14 |
| 15 | 39 | 45 | 23 | 41 | 22 | 29 | 19 | 40 | 10 | 26 | 30 | 31 | 43 | 46 | 35 | 44 | 11 | 38 | 33 | 20 | 5 | 13 | 15 |
| 16 | 4 | 1 | 12 | 3 | 36 | 9 | 14 | 27 | 42 | 34 | 32 | 8 | 2 | 24 | 6 | 25 | 18 | 28 | 7 | 37 | 21 | 17 | 16 |
| 17 | 16 | 4 | 1 | 12 | 3 | 36 | 9 | 14 | 27 | 42 | 34 | 32 | 8 | 2 | 24 | 6 | 25 | 18 | 28 | 7 | 37 | 21 | 17 |
| 18 | 28 | 7 | 37 | 21 | 17 | 16 | 4 | 1 | 12 | 3 | 36 | 9 | 14 | 27 | 42 | 34 | 32 | 8 | 2 | 24 | 6 | 25 | 18 |
| 19 | 40 | 10 | 26 | 30 | 31 | 43 | 46 | 35 | 44 | 11 | 38 | 33 | 20 | 5 | 13 | 15 | 39 | 45 | 23 | 41 | 22 | 29 | 19 |
| 20 | 5 | 13 | 15 | 39 | 45 | 23 | 41 | 22 | 29 | 19 | 40 | 10 | 26 | 30 | 31 | 43 | 46 | 35 | 44 | 11 | 38 | 33 | 20 |
| 21 | 17 | 16 | 4 | 1 | 12 | 3 | 36 | 9 | 14 | 27 | 42 | 34 | 32 | 8 | 2 | 24 | 6 | 25 | 18 | 28 | 7 | 37 | 21 |
| 22 | 29 | 19 | 40 | 10 | 26 | 30 | 31 | 43 | 46 | 35 | 44 | 11 | 38 | 33 | 20 | 5 | 13 | 15 | 39 | 45 | 23 | 41 | 22 |
| 23 | 41 | 22 | 29 | 19 | 40 | 10 | 26 | 30 | 31 | 43 | 46 | 35 | 44 | 11 | 38 | 33 | 20 | 5 | 13 | 15 | 39 | 45 | 23 |
| 24 | 6 | 25 | 18 | 28 | 7 | 37 | 21 | 17 | 16 | 4 | 1 | 12 | 3 | 36 | 9 | 14 | 27 | 42 | 34 | 32 | 8 | 2 | 24 |
| 25 | 18 | 28 | 7 | 37 | 21 | 17 | 16 | 4 | 1 | 12 | 3 | 36 | 9 | 14 | 27 | 42 | 34 | 32 | 8 | 2 | 24 | 6 | 25 |
| 26 | 30 | 31 | 43 | 46 | 35 | 44 | 11 | 38 | 33 | 20 | 5 | 13 | 15 | 39 | 45 | 23 | 41 | 22 | 29 | 19 | 40 | 10 | 26 |
| 27 | 42 | 34 | 32 | 8 | 2 | 24 | 6 | 25 | 18 | 28 | 7 | 37 | 21 | 17 | 16 | 4 | 1 | 12 | 3 | 36 | 9 | 14 | 27 |
| 28 | 7 | 37 | 21 | 17 | 16 | 4 | 1 | 12 | 3 | 36 | 9 | 14 | 27 | 42 | 34 | 32 | 8 | 2 | 24 | 6 | 25 | 18 | 28 |
| 29 | 19 | 40 | 10 | 26 | 30 | 31 | 43 | 46 | 35 | 44 | 11 | 38 | 33 | 20 | 5 | 13 | 15 | 39 | 45 | 23 | 41 | 22 | 29 |
| 30 | 31 | 43 | 46 | 35 | 44 | 11 | 38 | 33 | 20 | 5 | 13 | 15 | 39 | 45 | 23 | 41 | 22 | 29 | 19 | 40 | 10 | 26 | 30 |
| 31 | 43 | 46 | 35 | 44 | 11 | 38 | 33 | 20 | 5 | 13 | 15 | 39 | 45 | 23 | 41 | 22 | 29 | 19 | 40 | 10 | 26 | 30 | 31 |
| 32 | 8 | 2 | 24 | 6 | 25 | 18 | 28 | 7 | 37 | 21 | 17 | 16 | 4 | 1 | 12 | 3 | 36 | 9 | 14 | 27 | 42 | 34 | 32 |
| 33 | 20 | 5 | 13 | 15 | 39 | 45 | 23 | 41 | 22 | 29 | 19 | 40 | 10 | 26 | 30 | 31 | 43 | 46 | 35 | 44 | 11 | 38 | 33 |
| 34 | 32 | 8 | 2 | 24 | 6 | 25 | 18 | 28 | 7 | 37 | 21 | 17 | 16 | 4 | 1 | 12 | 3 | 36 | 9 | 14 | 27 | 42 | 34 |
| 35 | 44 | 11 | 38 | 33 | 20 | 5 | 13 | 15 | 39 | 45 | 23 | 41 | 22 | 29 | 19 | 40 | 10 | 26 | 30 | 31 | 43 | 46 | 35 |
| 36 | 9 | 14 | 27 | 42 | 34 | 32 | 8 | 2 | 24 | 6 | 25 | 18 | 28 | 7 | 37 | 21 | 17 | 16 | 4 | 1 | 12 | 3 | 36 |
| 37 | 21 | 17 | 16 | 4 | 1 | 12 | 3 | 36 | 9 | 14 | 27 | 42 | 34 | 32 | 8 | 2 | 24 | 6 | 25 | 18 | 28 | 7 | 37 |
| 38 | 33 | 20 | 5 | 13 | 15 | 39 | 45 | 23 | 41 | 22 | 29 | 19 | 40 | 10 | 26 | 30 | 31 | 43 | 46 | 35 | 44 | 11 | 38 |
| 39 | 45 | 23 | 41 | 22 | 29 | 19 | 40 | 10 | 26 | 30 | 31 | 43 | 46 | 35 | 44 | 11 | 38 | 33 | 20 | 5 | 13 | 15 | 39 |
| 40 | 10 | 26 | 30 | 31 | 43 | 46 | 35 | 44 | 11 | 38 | 33 | 20 | 5 | 13 | 15 | 39 | 45 | 23 | 41 | 22 | 29 | 19 | 40 |
| 41 | 22 | 29 | 19 | 40 | 10 | 26 | 30 | 31 | 43 | 46 | 35 | 44 | 11 | 38 | 33 | 20 | 5 | 13 | 15 | 39 | 45 | 23 | 41 |
| 42 | 34 | 32 | 8 | 2 | 24 | 6 | 25 | 18 | 28 | 7 | 37 | 21 | 17 | 16 | 4 | 1 | 12 | 3 | 36 | 9 | 14 | 27 | 42 |
| 43 | 46 | 35 | 44 | 11 | 38 | 33 | 20 | 5 | 13 | 15 | 39 | 45 | 23 | 41 | 22 | 29 | 19 | 40 | 10 | 26 | 30 | 31 | 43 |
| 44 | 11 | 38 | 33 | 20 | 5 | 13 | 15 | 39 | 45 | 23 | 41 | 22 | 29 | 19 | 40 | 10 | 26 | 30 | 31 | 43 | 46 | 35 | 44 |
| 45 | 23 | 41 | 22 | 29 | 19 | 40 | 10 | 26 | 30 | 31 | 43 | 46 | 35 | 44 | 11 | 38 | 33 | 20 | 5 | 13 | 15 | 39 | 45 |
| 46 | 35 | 44 | 11 | 38 | 33 | 20 | 5 | 13 | 15 | 39 | 45 | 23 | 41 | 22 | 29 | 19 | 40 | 10 | 26 | 30 | 31 | 43 | 46 |
| 47 | 47 | 47 | 47 | 47 | 47 | 47 | 47 | 47 | 47 | 47 | 47 | 47 | 47 | 47 | 47 | 47 | 47 | 47 | 47 | 47 | 47 | 47 | 47 |

Seed → 1  12  3  36  9  14  27  42  34  32  8  2  24  6  25  18  28  7  37  21  17  16  4  1

*Fig. 10*

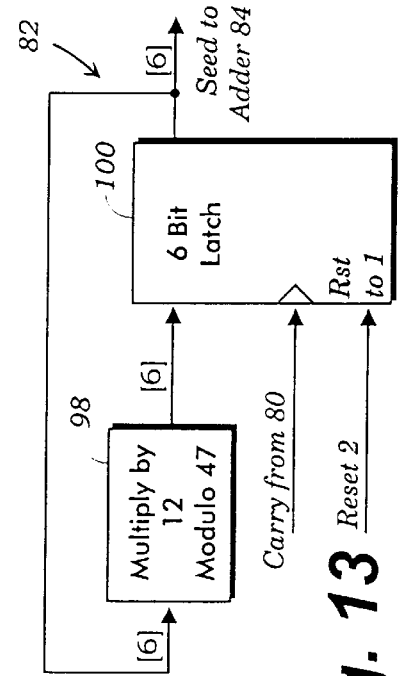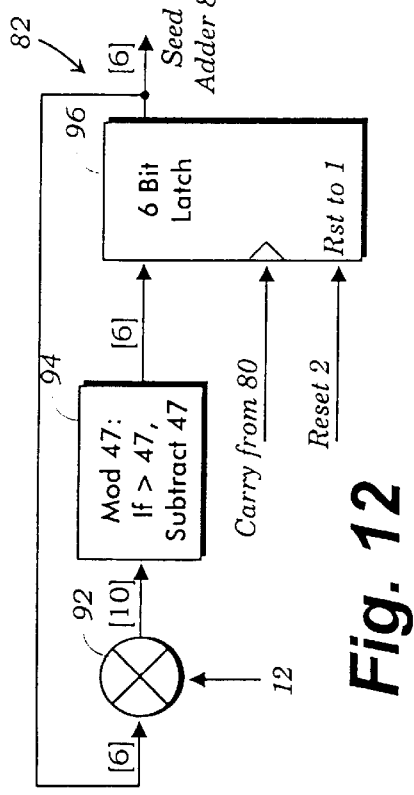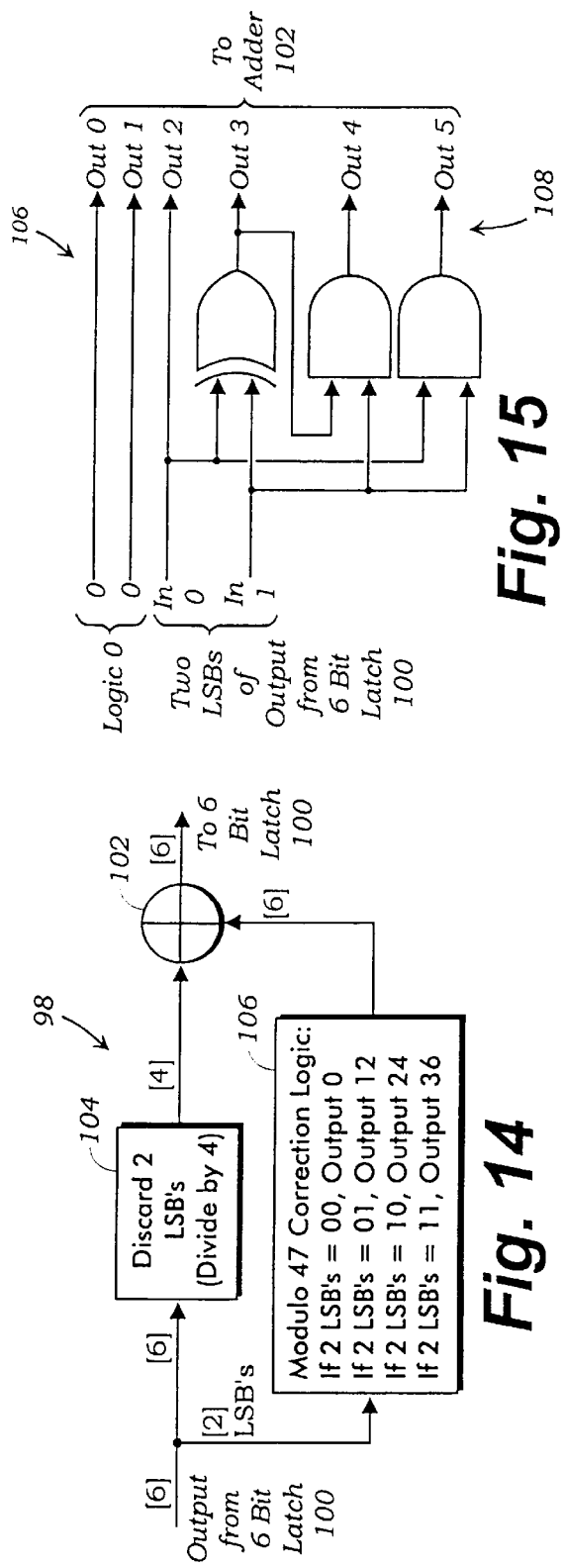
Fig. 13
Fig. 15
Fig. 12
Fig. 14

APPARATUS FOR DE-ROTATING AND DE-INTERLEAVING DATA INCLUDING PLURAL MEMORY DEVICES AND PLURAL MODULO MEMORY ADDRESS GENERATORS

TECHNICAL FIELD OF THE INVENTION

The present invention relates to an apparatus and method for de-rotating and/or de-interleaving data.

BACKGROUND OF THE INVENTION

In an 8 vestigial sideband (VSB) terrestrial communication system, information may be transmitted to a receiving station over the air. In an example of such a system, each two bits of data to be communicated is converted to a three-bit trellis code which is mapped as a symbol having eight possible levels so that each byte of data is represented by four symbols. The symbols are interleaved, and some of the symbols are rotated before they are transmitted in data frames.

A data frame that is used in an 8 VSB terrestrial communication system is disclosed in the Advanced Television Systems Comittee (ATSC) Digital Television Standard (published on Sep. 16, 1995) and particularly in Annex D, section 4.1 thereof. This data frame is comprised of a plurality of segments (i.e., lines) wherein each segment contains groups of data and wherein each group of data includes a plurality of data elements. For example, each segment may contain sixty-nine groups of data, each group of data may include twelve data elements, and a data element may be a symbol of data. The first segment of such a data frame contains frame synchronization information, and each subsequent segment in the data frame has an initial portion containing segment synchronization information (in the form of four segment sync symbols) and a succeeding portion containing data.

Because of the frame and segment synchronization information contained in a data frame, the data elements in certain groups of data may be rotated in order to facilitate the corrosion of transmission errors by the receiver. This rotation is described in Annex D, section 4.2.5 and in table 2 of the aforementioned Standard. Accordingly, the rotated and interleaved data received by a receiver must be de-rotated and de-interleaved.

The present invention is directed to an apparatus for de-rotating and/or de-interleaving data elements such as symbols.

SUMMARY OF THE INVENTION

In accordance with one aspect of the present invention, an apparatus for processing rotated and interleaved data comprises de-rotating means and de-interleaving means. The de-rotating means de-rotates the rotated and interleaved data in order to produce de-rotated and interleaved data. The de-interleaving means de-interleaves the de-rotated and interleaved data in order to produce de-rotated and de-interleaved data.

In accordance with another aspect of the present invention, an apparatus for processing rotated and interleaved data comprises first and second storing means and first and second addressing means. The first storing means stores D elements of the rotated and interleaved data. The first addressing means addresses the first storing means in order to read de-rotated and interleaved data out of the first storing means and to write rotated and interleaved data into the first storing means. The second storing means stores mD elements of the de-rotated and interleaved data read out of the first storing means. The second addressing means addresses the second storing means in order to read de-rotated and de-interleaved data out of the second storing means and to write de-rotated and interleaved data from the first storing means into the second storing means.

In accordance with yet another aspect of the present invention, an apparatus is arranged to de-rotate rotated data. The rotated data is rotated on the basis of D data elements. The apparatus comprises storing means and addressing means. The storing means stores D data elements of the rotated data in corresponding D storage locations. The addressing means addresses the storing means in order to read de-rotated data out of the D storage locations and to write rotated data into the D storage locations.

BRIEF DESCRIPTION OF THE DRAWINGS

These and other features and advantages of the present invention will become more apparent from a detailed consideration of the invention when taken in conjunction with the drawings in which:

FIG. 1 illustrates an example of data in row major order and is useful in explaining interleaving of data to be de-interleaved according to the present invention;

FIG. 2 illustrates an example of data and is useful in explaining rotation of data to be de-rotated according to the present invention;

FIG. 3 illustrates a de-rotating and de-interleaving apparatus according to the present invention;

FIG. 4 is a timing diagram for the demodulator 30 of FIG. 3;

FIG. 5 is a timing diagram for the controller 34 of FIG. 3;

FIG. 6 illustrates the address generator 36 of FIG. 3 in additional detail;

FIG. 7 illustrates an example of data which is useful in explaining the operation of the address generator 36 illustrated in FIG. 6;

FIG. 10 illustrates the address sequences produced by the address generator 40 of FIG. 3;

FIG. 12 illustrates a first embodiment of the seed generator 82 of FIG. 8 in additional detail;

FIG. 13 illustrates a second embodiment of the seed generator 82 of FIG. 8 in additional detail;

FIG. 14 illustrates the multiply by twelve and modulo forty-seven operator 98 of FIG. 13 in additional detail;

FIG. 15 illustrates the modulo forty-seven correction logic 106 of FIG. 14 in additional detail; and, FIG. 16 illustrates a second embodiment of the address generator 40 of FIG. 3 in additional detail.

DETAILED DESCRIPTION

Figures 8, 9:
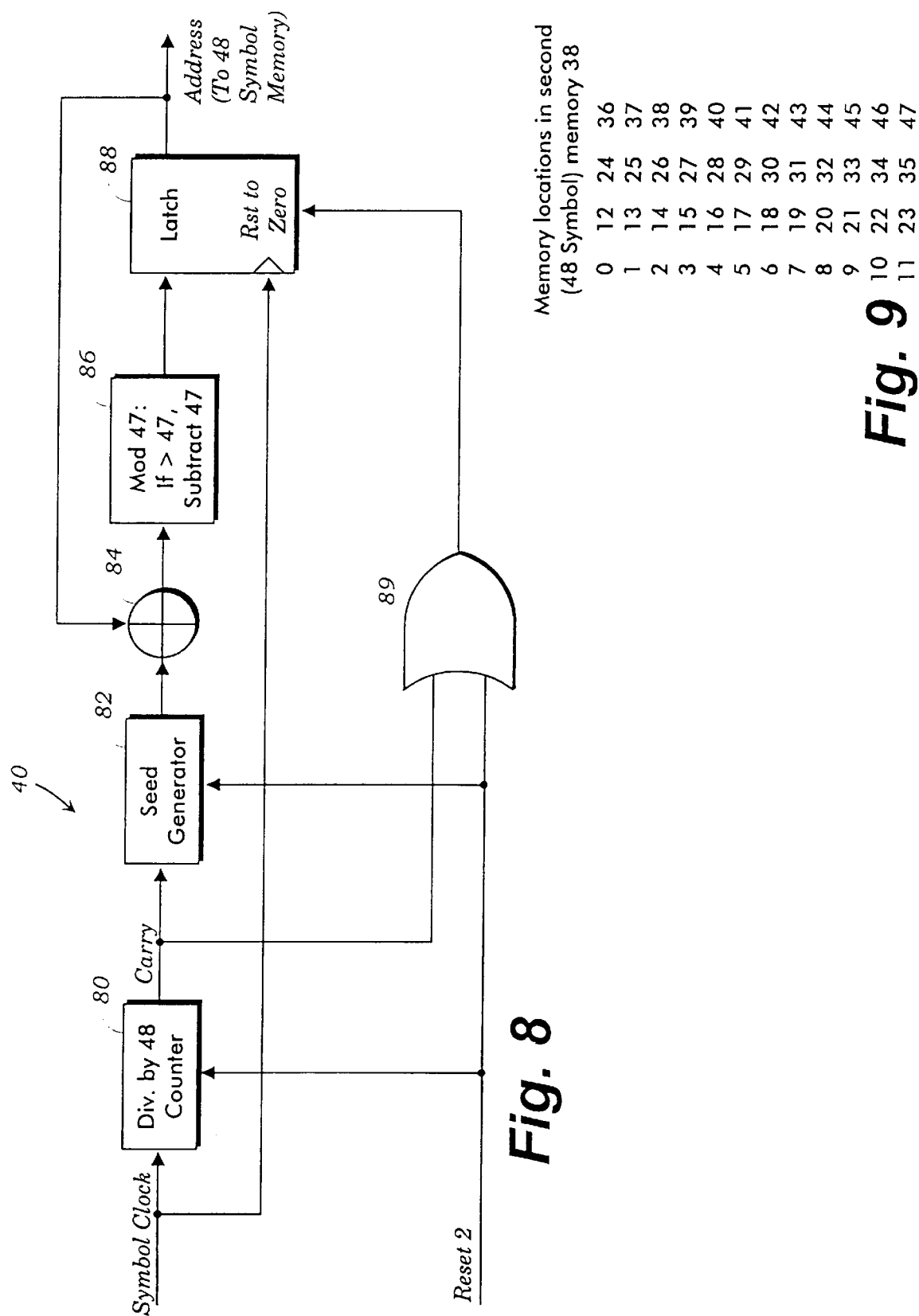
FIG. 8 illustrates a first embodiment of the address generator 40 of FIG. 3 in additional detail.
FIG. 9 represents the memory locations of the second memory means 38.

FIG. 1 illustrates a plurality of bytes of data elements which have resulted from scanning part of a scene. The first byte of data contains the data symbols $A_1$, $A_2$, $A_3$, and $A_4$. Each of these data symbols may represent, for example, two bits of data. The first byte of data symbols, therefore, represents eight bits of data. The second byte of data contains the data symbols $B_1$–$B_4$, the third byte of data contains the data symbols $C_1$–$C_4$, . . . and the twelfth byte of data contains the data symbols $L_1$–$L_4$.

A symbol interleaver in a transmitter may be configured to interleave the data symbols of FIG. 1, although any other arrangement of data symbols or data elements may be interleaved. Accordingly, the symbol interleaver converts the data symbols illustrated in FIG. 1 from row major ordering to column major ordering so that the data symbols are transmitted as column major ordered data elements. Consequently, instead of the transmitter transmitting the data symbol $A_2$ after the data symbol $A_1$, the data symbol $A_3$ after the data symbol $A_2$, the data symbol $A_4$ after the data symbol $A_3$, the data symbol $B_1$ after the data symbol $A_4$, and so on, the transmitter (ignoring other processing which may change the ordering of the data symbols) transmits in sequence the data symbol $A_1$, the data symbol $B_1$, . . . the data symbol $L_1$, the data symbol $A_2$, . . . Thus, each column of data symbols as shown in FIG. 1 represents a group of twelve data elements such that the first column is transmitted first, the second column is transmitted second, and so on.

FIG. 2 shows one group of data symbols in a segment 20 of a data frame. As shown in FIG. 2, the group of data symbols in this group of data symbols in the segment 20 are not rotated. However, other groups of data symbols in the segment 20 or in other segments may be rotated. For example, the data symbols in a group of data symbols in a segment 22 have been rotated by eight, and the data symbols in a group of data symbols in a segment 24 have been rotated by four (although in the embodiment of the present invention described hereinafter, it is assumed that the transmitter does not rotate data by four). Thus, the data symbols shown in FIGS. 1 and 2 are then transmitted as interleaved and rotated data.

FIG. 3 illustrates an apparatus 28 for de-rotating and de-interleaving interleaved and rotated data. The apparatus 28 includes a demodulator 30 (such as an ATSC 8 VSB demodulator). The demodulator 30 receives an ATSC standard 8 VSB terrestrial mode signal and produces the following four output signals: a frame sync signal, which occurs at the end of the frame sync segment (seg); a segment sync signal, which occurs coincident with the first symbol clock of each data segment; a symbol clock signal; and, interleaved and rotated data. The interleaved and rotated data are supplied to a first memory, here a twelve symbol memory, 32. Hereinafter, memory 32 may be alternatively referred to as the first memory 32 or the twelve symbol memory 32. There are 312 segment sync signals produced for every frame, but there is no segment sync created for the frame sync segment. There are 828 symbol clocks produced for each data segment, and each symbol clock is coincident with a corresponding data symbol. However, there are no symbol clocks created during either the time corresponding to the frame sync segment or the time corresponding to the four segment sync symbols of a segment sync signal. Therefore, symbol clocks only exist corresponding to data symbols. FIG. 4 is a timing diagram illustrating the outputs of the demodulator 30.

The frame sync signal, the segment sync signal, and the symbol clock signal are supplied to a controller 34, and the controller 34 produces the following five output signals: a segment (seg) count signal; a group count signal; two reset signals, RESET 1 and RESET 2; and, a byte clock signal. The seg count signal is the output of a divide by four counter which is reset to zero by the coincidence of the frame sync and seg sync signals. Thereafter, it is incremented by each seg sync signal which causes the seg count signal to cycle through the counts 0, 1, 2, 3, 0, 1, 2, 3 . . . . Because there are 312 segment sync signals per frame, and because 312 is divisible by four, the seg count signal cycles through its four values 78 times (312/4) per frame.

The group count signal is the output of a counter that counts groups of twelve symbol clocks. The group count signal is incremented by one when twelve symbol clocks have occurred. It is reset to zero by the coincidence of the seg sync signal and the symbol clock signal. Because there are 828 symbols per segment, and because 828/12=69, the group count signal will cycle from 0 to 68 during each data segment. Thus, the group count signal output cycles through the counts 0, 1, . . . 68, 0, 1 . . . 68, 0 . . . . The RESET 1 signal is derived from the frame sync signal. The RESET 2 signal is a twelve symbol clock delayed version of the RESET 1 signal. The byte clock signal is generated every fourth symbol clock. FIG. 5 is a timing diagram illustrating the outputs of the controller 34.

The segment count signal, the group count signal, the symbol clock signal, and the RESET 1 signal are supplied to a first address generator 36 which supplies addresses to the first memory 32. Accordingly, in response to the segment count signal, the group count signal, and the RESET 1 signal from the controller 34, as well as the symbol clock signal, the address generator 36 reads out of the first memory 32 a group of de-rotated and interleaved data and writes into the first memory 32 a group of rotated and interleaved data to replace the group of data which was read out.

In the above example where a group of data includes twelve data symbols and where each data symbol represents two bits of information, the first memory 32 is a twelve symbol memory. Thus, in response to the segment count signal, the group count signal, the symbol clock signal, and the RESET 1 signal, the address generator 36 reads out of the first memory 32 twelve de-rotated and interleaved data symbols and writes into the first memory 32 twelve rotated and interleaved data symbols to replace the twelve data symbols which were read out. More specifically, in response to a first symbol clock pulse, the address generator 36 reads out of a first storage location of the first memory 32 a first data symbol and writes into the first storage location of the first memory 32 a data symbol to replace the first data symbol which was read out. In response to a second symbol clock pulse, the address generator 36 increments its output address by one, reads out of a second storage location of the first memory 32 a second data symbol and writes into the second storage location of the first memory 32 a data symbol to replace the second data symbol which was read out, and so on until all twelve data symbols in a group have been read out and replaced. The addresses that are supplied by the first address generator 36 to the first memory 32 are arranged to de-rotate the rotated data symbols stored in the first memory 32. The de-rotation of the rotated data stored in the first memory 32 is explained in more detail in connection with FIG. 6.

Accordingly, the data supplied at the output of the first memory 32 is de-rotated but is still interleaved. The de-rotated but still interleaved data are supplied to a second memory, here a forty-eight (48) symbol memory, 38. Hereinafter, the second memory 38 may be alternatively referred to as the second memory 38 or the forty-eight (48) symbol memory 38. The second memory 38 and a second address generator 40 are provided in order to de-interleave the de-rotated, but still interleaved, data. The symbol clock signal from the demodulator 30 and the RESET 2 signal from the controller 34 are provided to the address generator 40. In response to the symbol clock signal, the second address generator 40 generates addresses for the second memory 38 such that each address causes one of the data symbols stored in a corresponding storage location of the second memory 38 to be read out and causes a data symbol from the first memory 32 to be written into that storage location of the second memory 38 to replace the data symbol just read out, and so on. Based upon the addresses generated by the second address generator 40, the de-rotated but interleaved data stored in the second memory 38 is read out as de-rotated and de-interleaved data. This de-rotated and de-interleaved data is supplied to a series-to-parallel converter 42 which receives each two bit data symbol from the second memory 38, and converts the bits of four data symbols to a byte of eight parallel bits in response to the byte clock from the controller 34.

The first address generator 36 of FIG. 3 is shown in more detail in FIG. 6. The first address generator 36 includes an address counter 50, an offset generator 52, and a modulo twelve (12) adder 54. The address counter 50 counts twelve symbol clocks and then resets. The output of the address counter 50, therefore, varies from zero to eleven and then resets to zero. The offset generator 52 responds to the group count signal and the segment (seg) count signal from the controller 34 in order to generate an offset (which may alternatively be referred to as a seed.) The modulo twelve adder 54 adds the output count from the address counter 50 and the offset from the offset generator 52 in order to generate an address which is supplied to the first memory 32. The offset generator 52 may be simply a set of standard logic elements which are configured according to the equations shown in FIG. 6. Alternatively, the offset generator 52 may include a read only memory and an address decoder which decodes the group count and segment count signals in order to access certain memory locations in the read only memory for the offsets to be supplied to the modulo twelve adder 54.

FIG. 6 provides an example of the offsets which may be generated by the offset generator 52. These offsets are based upon the following rotation protocol (see the aforementioned ATSC Digital Television Standard) implemented by a transmitter: (i) the data symbols in the first segment of each set of four segments are not rotated; (ii) the data symbols in groups 0, 1, and 2 of the second segment in each set of four segments are rotated by eight and the other groups of data symbols in this segment are not rotated; (iii) the data symbols in groups 0 and 1 of the third segment in each set of four segments are rotated by eight and the data symbols in the other groups of data in this segment are not rotated; and (iv) the data symbols in group 0 of the fourth segment in each set of four segments are rotated by eight and the data symbols in the other groups of data in this segment are not rotated. Thus, the rotation protocol is repeated every four segments, and only certain groups of data in certain segments are rotated.

Accordingly, because the first segment in each set of four segments (which corresponds to a segment count of zero) is not rotated, the offset generator 52 provides an output offset of zero for the first segment in each set of four segments. This output offset of zero is added by the modulo twelve adder 54 to twelve output counts from the address counter 50 in order to generate twelve addresses to read out twelve data symbols from the first memory 32 and write in twelve new data symbols to the first memory 32.

When the segment count is one and the group count is zero (i.e., the first group of twelve data symbols which is in the second segment in each set of four segments and which was rotated by eight), the offset generator 52 provides an output offset of zero. This output offset of zero is added by the modulo twelve adder 54 to twelve output counts from the address counter 50 in order to generate twelve addresses to read out twelve data symbols from the first memory 32. When the segment count is one and the group count is one (i.e., the second group of twelve data symbols which is in the second segment in each set of four segments and which was rotated by eight), the offset generator 52 provides an output offset of eight. This output offset of eight is added in modulo twelve fashion by the modulo twelve adder 54 to twelve output counts from the address counter 50 in order to generate twelve addresses to read out twelve data symbols from the first memory 32. When the segment count is one and the group count is two (i.e., the third group of twelve data symbols which is in the second segment in each set of four segments and which was rotated by eight), the offset generator provides an output offset of four which is added in modulo twelve fashion by the modulo twelve adder 54 to twelve output counts from the address counter 50 in order to generate twelve addresses to read out twelve data symbols from the first memory 32. When the segment count is one and the group count is three through sixty-eight, the offset generator provides an output offset of zero which is added in modulo twelve fashion by the modulo twelve adder 54 to sets of twelve output counts from the address counter 50 in order to generate corresponding sets of twelve addresses to read out corresponding sets of twelve data symbols from the first memory 32.

When the segment count is two and the group count is zero (i.e., the first group of twelve data symbols in the third segment in each set of four segments), the offset generator 52 provides an output offset of zero which is added by the modulo twelve adder 54 to twelve output counts from the address counter 50 in order to generate twelve addresses to read out twelve data symbols from the first memory 32. When the segment count is two and the group count is one (i.e., the second group of twelve data symbols in the second segment in each set of four segments), the offset generator 52 provides an output offset of eight which is added in modulo twelve fashion by the modulo twelve adder 54 to twelve output counts from the address counter 50 in order to generate twelve addresses to read out twelve data symbols from the first memory 32. When the segment count is two and the group count is two through sixty-eight, the offset generator provides an output offset of four which is added in modulo twelve fashion by the modulo twelve adder 54 to sets of twelve output counts from the address counter 50 in order to generate corresponding sets of twelve addresses to read out corresponding sets of twelve data symbols from the first memory 32.

When the segment count is three and the group count is zero (i.e., the first group of twelve data symbols in the fourth segment in each set of four segments), the offset generator 52 provides an output offset of four which is added in modulo twelve fashion by the modulo twelve adder 54 to twelve output counts from the address counter 50 in order to generate twelve addresses to read out twelve data symbols from the first memory 32. When the segment count is three and the group count is one through sixty-eight, the offset generator provides an output offset of zero which is added by the modulo twelve adder 54 to sets of twelve output counts from the address counter 50 in order to generate corresponding sets of twelve addresses to read out corresponding sets of twelve data symbols from the first memory 32.

FIG. 7 illustrates an example of how the address generator 36 operates in cooperation with the first memory 32 in order to de-rotate the rotated and interleaved data from the demodulator 30. When the data in the last group of segment zero has been stored in the first memory 32, this data is stored in the storage locations of the first memory 32 in the data order shown by row 60. This data is unrotated. Row 62 contains the first group of data of segment one which is currently being received by the demodulator 30. This data is rotated by eight, as indicated by the row 62. Because the segment count is one and the group count is zero at this time, the offset which is applied by the offset generator 52 to the modulo twelve adder 54 is zero. Accordingly, the addresses provided by the modulo twelve adder 54 are in order of the output counts supplied by the address counter 50.

Thus, the modulo twelve adder 54 supplies an address of zero to the memory 32 in order to read out the data symbol A of row 60 from storage location zero of the first memory 32 and in order to write the data symbol E of row 62 into storage location zero of the first memory 32. The modulo twelve adder 54 then supplies an address of one to the memory 32 in order to read out the data symbol B of row 60 from storage location one of the first memory 32 and in order to write the data symbol F of row 62 into storage location one of the first memory 32. The addresses supplied by the modulo twelve adder 54 increase in order up to eleven so that the data symbols of row 60 are read out of the first memory 32 and are replaced by the corresponding data symbols of row 62. Consequently, row 64 indicates the contents of the first memory 32 when row 62 has been written into the first memory 32.

At this point, the segment count is one and the group count increments to one, and the next group of data symbols, as shown in row 66, is received by the demodulator 30. As this data is received, the offset generator 52 generates an offset of eight, which is supplied to the modulo twelve adder 54. Accordingly, the modulo twelve adder 54 adds the offset of eight to the first output count of zero from the address counter 50 to generate an address of eight. In response to an address of eight, the data symbol A stored at the storage location eight of the first memory 32 (see row 64) is read out and is replaced by the first received data symbol of group one, i.e., data symbol E of row 66. Similarly, the data symbol B is read out and is replaced by the data symbol F when the address is nine (offset of eight plus a count of one), the data symbol C is read out and is replaced by the data symbol G when the address is ten (offset of eight plus a count of two), the data symbol D is read out and is replaced by the data symbol H when the address is eleven (offset of eight plus a count of three), the data symbol E is read out and is replaced by the data symbol I when the address is zero (offset of eight plus a count of four which produces an address of zero following the modulo twelve operation), and so on such that row 68 of FIG. 7 indicates the data symbols now stored in the storage locations zero through eleven of the first memory 32.

Row 70 indicates the next group of data which is received, i.e., when the segment count is one and the group count is two. When the segment count is one and the group count is two, the offset generator 52 generates an offset of four. This offset of four is added by the module twelve adder 54 to the output counts supplied by the address counter 50 in order to generate the addresses for the first memory 32. As the data in row 70 is received, the modulo twelve adder 54 adds the offset of four to the first output count of zero from the address counter 50 to generate an address of four. In response to an address of four, the data symbol A stored at the storage location four of the first memory 32 (see row 68) is read out and is replaced by the first received data symbol of group two, i.e., data symbol E of row 70. Similarly, the data symbol B is read out and is replaced by the data symbol F when the address is five (offset of four plus a count of one), the data symbol C is read out and is replaced by the data symbol G when the address is six (offset of four plus a count of two), the data symbol D is read out and is replaced by the data symbol H when the address is seven (offset of four plus a count of three), the data symbol E is read out and is replaced by the data symbol I when the address is eight (seed of four plus a count of four), and so on such that row 72 of FIG. 7 indicates the data symbols now stored in the storage locations zero through eleven of the first memory 32. It is noted that when the output count of the address counter 50 reaches eight, the modulo twelve adder 54 provides an address of zero (a count of eight plus an offset of four followed by a modulo twelve operation) to the first memory 32.

Row 74 indicates that the segment one, group three data is unrotated. Thus, with an offset of zero, the contents of the first memory 32 as shown by row 72 is replaced by the received data symbols shown in row 74 so that the contents of the memory 32 is as shown in row 72 after the segment one, group three data are fully stored in the first memory 32.

As data is read out of the first memory 32, the data is de-rotated, but still interleaved. This de-rotated but interleaved data is processed by the second memory 38 and the second address generator 40 in order to de-interleave the de-rotated but interleaved data. Because the data symbols in each byte of data are interleaved with corresponding data symbols in eleven other bytes of data, and because there are four symbols per byte, the second memory 38 is a 48 symbol memory.

A first embodiment of the address generator 40 is illustrated in FIG. 8. This address generator includes a divide by forty-eight (48) counter 80 which provides a carry output on each count of forty-eight from the symbol clock. The carry output from the divide by forty eight counter 80 is supplied to a seed generator 82, and the seed generator 82 supplies a seed to a first input of an adder 84. The output of the adder 84 is supplied to a modulo forty-seven (47) operator 86 which performs a modulo forty-seven operation on the output of the adder 84. The output of the modulo forty-seven operator 86 is connected to a latch 88 which latches the output of the modulo forty-seven (operator 86 under control of the symbol clock. The output of the latch 88 provides an address to the second memory 38 and is also fed back to a second input of the adder 84.

The second memory 38 must have sufficient storage locations to store forty-eight symbols. Although the second memory 38 is a linear memory array, with storage locations addressed 0 to 47, it can be thought of as a rectangular array with R=12 rows and C=4 columns. Therefore, N=R×C=48. FIG. 9 illustrates the addresses of the second memory 38 viewed in this manner. If $x_n$ is a sequence of input symbols (where n=0 . . . 47), and if $M_i(n)$ represents a mapping of the input symbols $x_n$ to the memory locations in the second memory 38, $M_i(n)$ is the address in the second memory 38 where a corresponding symbol $x_n$ is to be stored. (The mapping $M_i(n)$ has a subscript i because there are a number of mappings, i.e. a number of address sequences supplied by the second address generator 40). If the initial mapping sequence $M_0(n)$ is chosen such that $M_0(n)$=n for n=0, 1, 2 . . . (N−1), each input symbol $x_n$ in the first block of forty-eight symbols is stored in memory location n. This can be visualized by overlaying FIG. 1 on top of FIG. 9.

In order to deinterleave this block of data, it must be read out of the second memory 38 in a different order than the order in which it was written into the second memory 38. So, as the next block of forty-eight symbols is received a symbol at a time, the symbols of the first block are read out from the second memory 38 and are replaced by the corresponding symbols just received from the second block. To deinterleave the first block, $M_1(n)$ must=0, 12, 24, 36, 1, 13 . . . 35, 47. Deinterleaving the first block of symbols according to these addresses causes the second block to be written into the second memory 38 in a different order than the first block was written. Therefore, to deinterleave the second block (while simultaneously writing the third block to the second memory 38), a new addressing sequence $M_2(n)$ must be generated that is different than $M_1(n)$. This process continues through a series of addressing sequences so as to continuously receive and deinterleave blocks of symbols.

If the first mapping sequence is $M_0(n)=0, 1, 2, 3, 4 \ldots 47$, then $M_1(n)$ can be written as $$M_1(n) = M_0((n \cdot R) \bmod (N-1)) \text{ for } n=0 \ldots N-1. \quad (1)$$

This expression arises because the interleave depth is R. Adjacent horizontal symbols are spaced by R items in the mapping function. The modulo portion properly controls the end of line wrap around and causes the proper offset as the index scans through the mapping function.

Similarly, mapping any sequence may be generated from the previous mapping according to the following equation:

$$M_i(n) = M_{i-1}((n \cdot R) \bmod (N-1)) \text{ for } n=0,1,2,\ldots,N-1. \quad (2)$$

Equivalently, using induction, this mapping function may be generalized to express the nth entry in the ith sequence using the initial (i=0) sequence as follows:

$$M_i(n) = M_0((n \cdot R^i) \bmod (N-1)) \text{ for } n=0,1,2,\ldots,N-1. \quad (3)$$

If it is assumed that the initial sequence is $M_0(n)=n$, equation (3) may be simplified as follows:

$$M_i(n) = (n \cdot R^i) \bmod (N-1) \text{ for } n=0,1,2,\ldots,N-1. \quad (4)$$

Equation (4) leads to an expression for calculating the nth entry in any sequence from the nth entry in the preceding sequence as follows:

$$M_i(n) = (M_{i-1}(n) \cdot R) \bmod (N-1) \text{ for } n=0,1,2,\ldots,N-1. \quad (5)$$

Equation (4) describes all of the addressing sequences that are necessary to deinterleave the input data from one block to the next. There are a finite number of different addressing sequences that equation (4) produces before returning to the initial sequence. This finite number of sequences depends upon the values of R (row) and C (column) (or equivalently upon the values of R and $N=R \times C$). Accordingly, there are L unique mappings, where L is the lowest number such that:

$$(R^L) \bmod (N-1) = 1 \text{ for L not 0}. \quad (6)$$

Finally, an expression relating the nth entry in any sequence i to the (n−1)th entry in that same sequence can be stated as follows:

$$M_i(n) = 0 \qquad \text{for } n = 0 \quad (7)$$
$$M_i(n) = (M_i(n-1) + R^i) \bmod (N-1) \text{ for } n = 1, 2, \ldots, N-1.$$

If R is 12 (as in the example shown in FIG. 1), a value of 23 for L satisfies equation (6). That is, equation (4) produces 23 unique sequences which are repeated beginning with L=24. Accordingly, for the data array shown in FIG. 1, there are 23 sequences which are required in order to de-interleave data that is interleaved as described above in connection with FIG. 1. FIG. 10 shows the twenty-three sequences and their corresponding seeds.

Equations (7) are the basis for the address generator 40 in order to generate the required repeating address sequences. Also required is a seed generator which embodies equation (6) in order to generate the seed for each address sequence.

The seeds, which are generated by the seed generator 82, are given by equation (6), where L varies from 0 to 22 in the example given in the present patent application. These seeds consist of the following: 1, 12, 3, 36, 9, 14, 27, 42, 34, 32, 8, 2, 24, 6, 25, 18, 28, 7, 37, 21, 17, 16, and 4. On each forty-eighth symbol clock pulse, the seed generator 82 supplies a corresponding one of these seeds to the adder 84 which adds the seed to the output of the latch 88 on each symbol clock pulse. The modulo forty-seven operator 86 performs a modulo forty-seven operation (if >47, subtract 47) on the output of the adder 84 and supplies the result to the latch 88. The latch 88 latches this result and supplies this latched result as an address to the second memory 38. In this manner, a unique sequence of forty-eight addresses is produced for each seed generated by the seed generator 82.

Figure 11A:
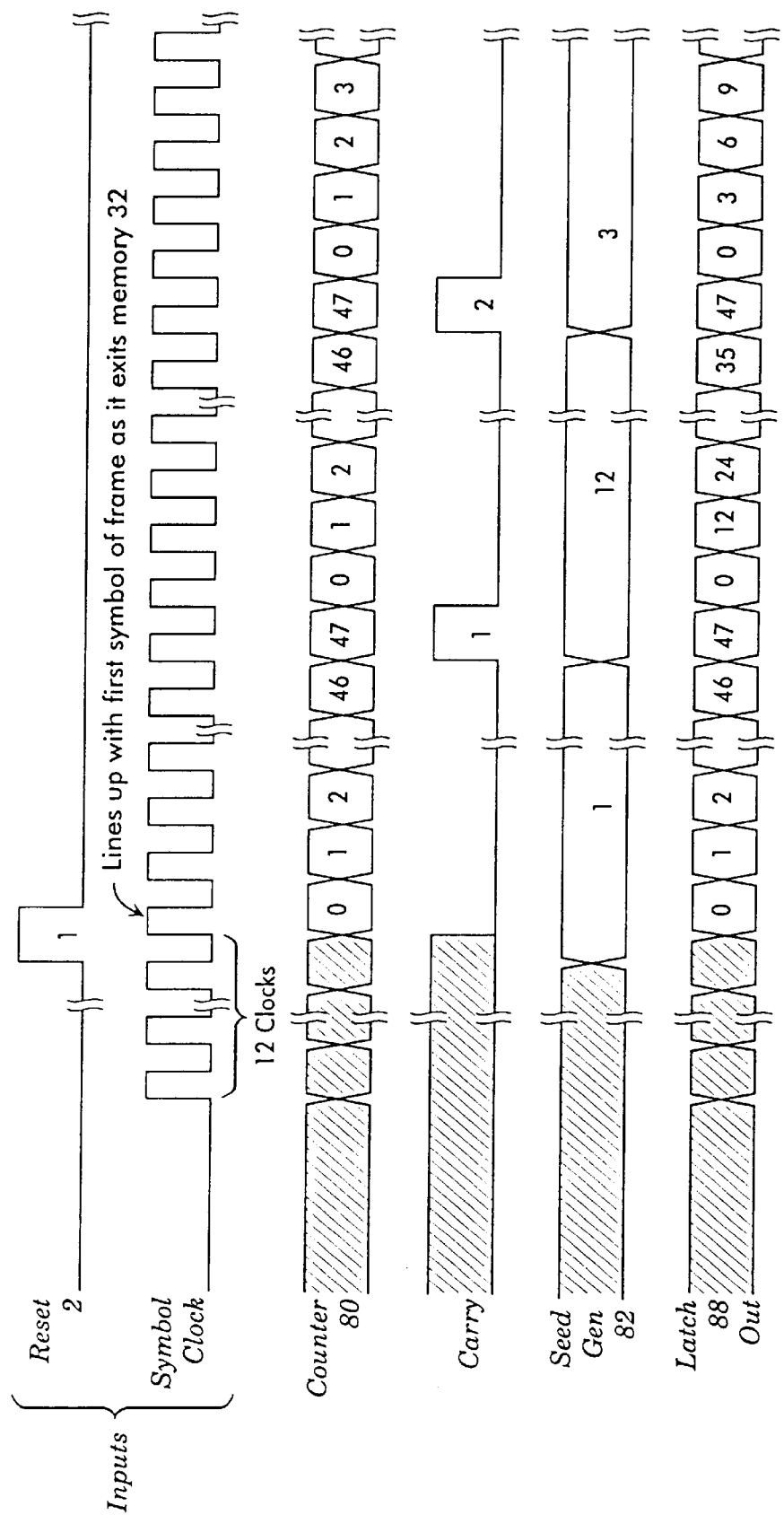
FIGS. 11A and 11B are timing diagrams for the address generator 40 of FIG. 3.
Figure 11B:
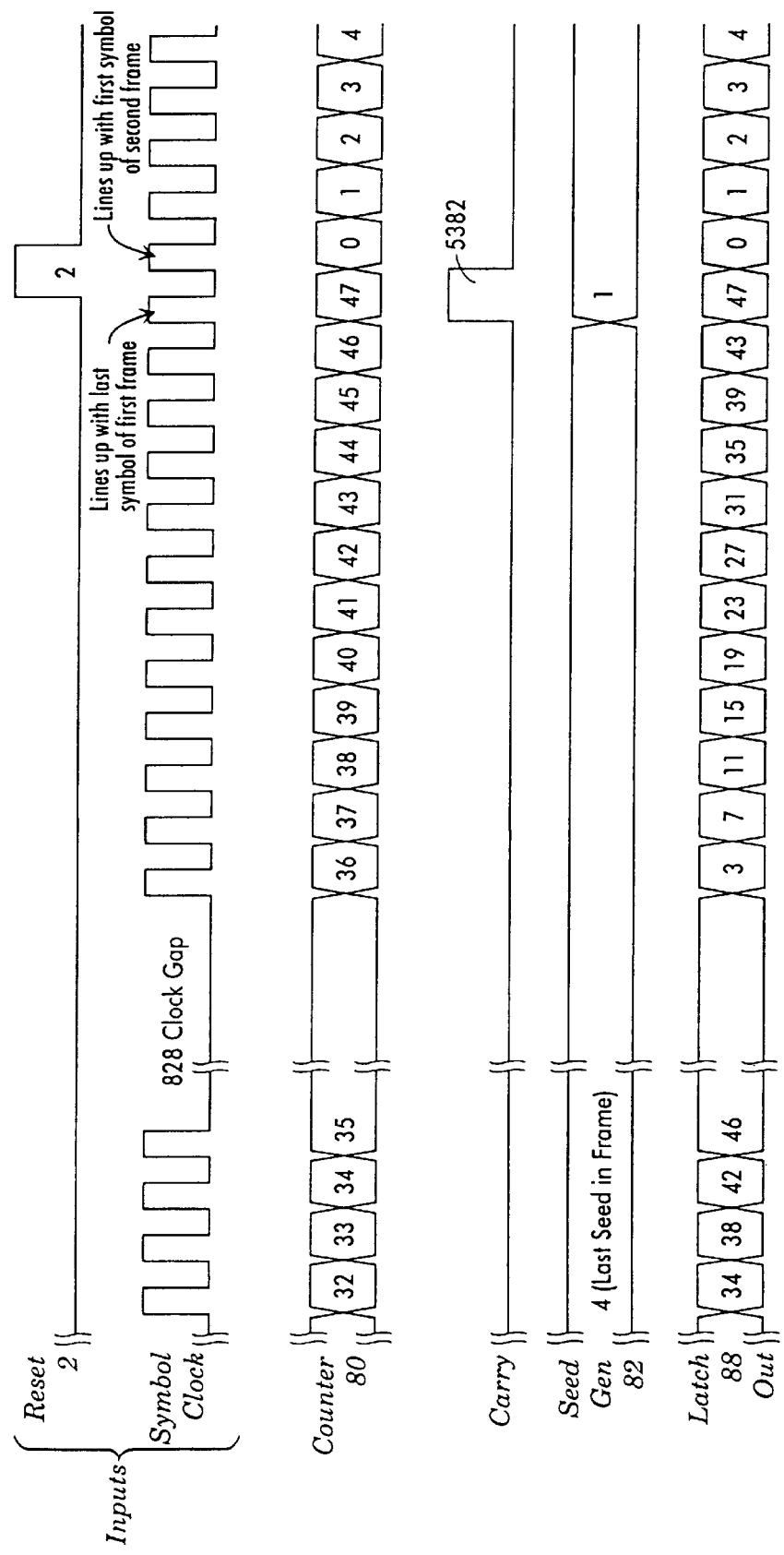

The address generator 40 is driven by RESET 2 and the symbol clock because the processing that occurs in the first memory 32 takes exactly 12 symbol clocks. Because the symbols passing through the first memory 32 are delayed by twelve symbol clocks, RESET 2 lines up correctly with the first symbol of a frame as it is output from the first memory 32. The timing diagrams of FIGS. 11A and 11B assume recent acquisition of the 8 VSB signal, so that the initial value of the counter 80, the carry output of the counter 80, the seed generator 82, and the latch 88 are unknown. RESET 2 and the first symbol clock cause the counter 80 to initialize to zero which in turn assures that the carry output is low. RESET 2 also causes the seed generator 82 to output the first seed (1). RESET 2 and the first symbol clock also cause the output of the latch 88 to synchronously clear to zero. Subsequent symbol clocks cause the counter 80 to increment.

When the counter 80 reaches a count=47, it outputs a carry signal which in turn causes the seed generator 82 to output the next sequential seed (12). This carry signal also causes the latch 88 to synchronously clear at the next symbol clock. Accordingly, the carry signals from the counter 80 cause the seed generator 82 to cycle through its sequence of 23 seeds repeatedly. Each seed thus has a duration of 48 symbols clocks. The full sequence of 23 seeds, therefore, encompasses 23×48=1104 symbols. Because there are 258336 data symbols in a frame, the sequence of 23 seeds occurs exactly 234 times in each frame (234×1104=258336). Therefore, the beginning of a new frame (indicated in the timing diagram of FIGS. 11A and 11B by RESET 2 pulse #2) always lines up with the first seed (1). This alignment is an advantage because it allows use of the first RESET 2 signal (derived from the frame sync signal and delayed as previously explained) after 8 VSB signal acquisition to initialize the seed generator 82 to an output of 1 without concern for the effect of subsequent RESET 2 signals (one per frame) because they will always coincide with a point in time when the seed generator 82 should have output of 1.

The sequence of seeds, once initiated after signal acquisition, should not be broken. This is necessary for correct continuous deinterleaver operation. The timing diagram also shows the latch 88 output corresponding to the required $M_i(n)$. Portions of $M_0(n)$, $M_1(n)$, and $M_2(n)$ are illustrated, occurring after RESET 2 pulse #1. The sequences are assumed to have cycled through all the $M_i(n)$ many times until at the end of the first frame $M_{22}(n)$ is shown to occur just before reset 2 pulse #2. The second frame begins with $M_0(n)$ as expected.

The de-interleaving operation is similar to the de-rotating operation which was explained with respect to FIGS. 6 and 7. That is, when a data symbol is read out from a storage location in the second memory 38, as determined by the second address generator 40, that data symbol is replaced by the next data symbol which is received from the first memory 32. Accordingly, when the symbol clock causes the divide by 48 counter 80 to reach a count of 47, the counter 80 will output a carry signal which is supplied to the seed generator 82 and to the latch 88 (via the OR gate 89). This carry output causes the seed generator 82 to supply a new seed to the adder 84. This carry output also clears the latch 88 (at the next symbol clock) so that its output is zero. The latch output is also supplied back to the second input of the adder 84.

For each of the 23 sequences shown in FIG. 10, the adder 84 adds the zero output of the latch 88 (which represents the first address in each sequence) to the seed supplied by the seed generator 82. This output of the adder 84 is controlled by a modulo forty-seven operation and the result is supplied to the input of the latch 88. The next symbol clock causes the latch 88 to supply this result of the modulo forty-seven operator 86 to the second memory 38. This output of the latch 88 is again fed back to the adder 84 to be added to the seed from the seed generator 82. Thus, the seed from the seed generator 82 is recursively added to itself modulo forty-seven to produce a corresponding sequence of addresses which is supplied to the second memory 38.

Each such sequence of addresses is given by equation (7). In each rotation of the twenty-three sequences, the first sequence is always in order from zero to 47. Also, the seed for this first sequence as supplied by the seed generator 82 is one, as determined by equation (6).

FIG. 12 illustrates a first embodiment of the seed generator 82 in more detail. The seed generator 82 includes a multiplier 92, a modulo forty-seven (47) operator 94, and a six (6) bit latch 96. The multiplier 92 multiplies the output of the latch 96 by twelve, the modulo forty-seven operator 94 performs a modulo forty-seven operation on the output of the adder 92, and the latch 96 latches the output of the modulo forty-seven operator 94.

When RESET 2 is produced by the controller 34, the latch 96 is reset so that its output is one. This one is supplied as the seed for the adder 84. This one is also multiplied by twelve by the multiplier 92 and the result is operated on by the modulo forty-seven operator 94. The output of the modulo forty-seven operator 94 is supplied to the latch 96 which latches this output through upon receipt of the next carry output from the divide by forty-eight counter 80. Upon receipt of this carry output, the output of twelve from the latch 96 is fed back to the multiplier 92 which multiplies this twelve by twelve to produce an output of 144 which is operated on by the modulo forty-seven operator 94. The output of the modulo forty-seven operator 94 (three) is supplied to the latch 96 which latches this output through upon receipt of the next carry output from the divide by forty-eight counter 80. Upon receipt of this carry output, the output of three from the latch 96 is fed back to the multiplier 92 which multiplies this three by twelve to produce an output of thirty-six which is operated on by the modulo forty-seven operator 94. The output of the modulo forty-seven operator 94 (i.e., thirty-six) is supplied to the latch 96 which latches this output through upon receipt of the next carry output from the divide by forty-eight counter 80. Upon receipt of this carry output, the output of thirty-six from the latch 96 is fed back to the multiplier 92 which multiplies this thirty-six by twelve to produce an output of 432, and so on. Accordingly, the seed generator 82 produces the twenty-three seeds described above.

FIG. 13 illustrates a second embodiment of the seed generator 82 in more detail. This seed generator 82 includes a multiply by twelve and modulo forty-seven operator 98 and a latch six (6) bit 100. The multiply by twelve and modulo forty-seven (47) operator 98, as shown in more detail in FIG. 14, includes an adder 102 which adds the four most significant bits from the output of the latch 100, after the two least significant bits have been discarded at 104 (a divide by four operation), to a correction factor from a modulo forty-seven (47) correction logic 106 which is shown in more detail in FIG. 15.

Referring to FIGS. 3, 8, 13, and 15, when RESET 2 is produced by the controller 34, the latch 100 is reset so that its output is one. This one is supplied as the seed for the adder 84. This one is also multiplied by twelve and the result is processed by a modulo forty-seven operation by the multiply by twelve and modulo forty-seven operator 98. The output of the multiply by twelve and modulo forty-seven operator 98 is supplied to the latch 100 which latches this output through upon receipt of the next carry output from the divide by forty-eight counter 80. The output of twelve from the latch is fed back to the multiply by twelve and modulo forty-seven operator 98, which multiplies this twelve by twelve, and processes the result (144) by a modulo forty-seven operation to produce an output of three. The output of three from the multiply by twelve and modulo forty-seven operator 98 is supplied to the latch 100 which latches this output through upon receipt of the next carry output from the divide by forty-eight counter 80, and so on. Accordingly, the seed generator 82 produces the twenty-three seeds described above.

The multiply by twelve and modulo forty-seven operator 98 is shown in more detail in FIG. 14. When the output of the latch 100 (FIG. 13) is one (i.e., a digital value of 000001), the two least significant bits (01) are fed to the modulo forty-seven correction logic 106 which provides an output of twelve. The output of twelve is added by the adder 102 to the four most significant bits (0000) of the output from the latch 100 and the result of twelve is supplied to the latch 100. The latch 100 latches the twelve to its output upon receipt of the next carry output from the divide by forty-eight counter 80. When the output of the latch 100 is twelve (i.e., a digital value of 001100), the two least significant bits (00) are fed to the modulo forty-seven correction logic 106 which provides an output of zero. This output of zero is added by the adder 102 to the four most significant bits (0011) of the output from the latch 100 and the result of three is supplied to the latch 100. The latch 100 latches the three to its output upon receipt of the next carry output from the divide by forty-eight counter 80 (FIG. 8), and so on.

The modulo forty-seven (47) correction logic 106 is shown in more detail in FIG. 15 and includes logic 108. The two least significant outputs, OUT 0 and OUT 1, of the logic 108 are always zero. The four most significant outputs, OUT 2–OUT 5, of the logic 108 are controlled by the two least significant bits in the output of the latch 100, IN 0 and IN 1.

Figure 16:
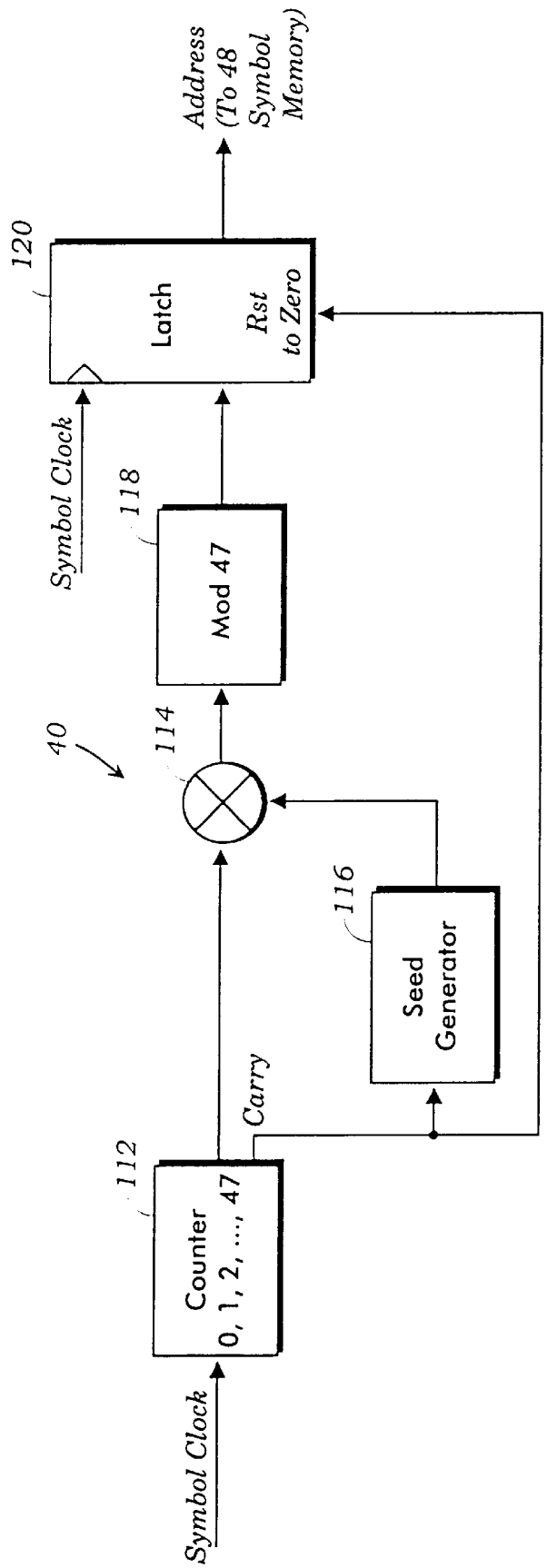

A second embodiment of the second address generator 40 based upon equation (4) is illustrated in FIG. 16. This second embodiment includes a counter 112 which counts symbol clock pulses and supplies an output on each count to a multiplier 114. The carry output of the counter 112 is supplied to a seed generator 116 which may be a state machine, or a RAM, or similar to the seed generator 82. The seed generator 116 is toggled through twenty-three states by the carry output from the counter 112 in order to supply a corresponding seed, as determined by equation (6), upon each toggle. The multiplier 114 multiplies the output count from the counter 112 by the seed provided by the seed generator 116 and supplies the result to a modulo forty-seven (47) operator 118. The output of the modulo forty-seven operator is supplied to the input of a latch 120. The output of the latch 120 is reset to zero by the carry output from the counter 112. Thus, at the beginning of each address sequence, the output of the latch 120 is equal to zero which is always the first address of each address sequence. At the end of each address sequence (i.e., the forty-eighth count), the seed generator 116 is toggled in order to supply a new seed to the multiplier 114.

Certain modifications of the present invention have been discussed above. Other modifications will occur to those practicing in the art of the present invention. For example, although the present invention has been specifically described in terms of two bit data symbols, it should be understood that the present invention applies to other data elements. Also, the present invention may be used in conjunction with different data frame arrangements and different rotation and/or interleaving protocols.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An apparatus for reordering block ordered first and second groups of data elements from a first block order to a second block order comprising:

a memory having a plurality of memory locations, wherein the first group of data elements is stored in the memory to be replaced by the second group of data elements; and, an address generator arranged to generate addresses and to supply the addresses to the memory so that, as each address is received by the memory, a first data element of the first group of data elements is read from a first memory location and so that a data element from the second group of data elements is written into the first memory location before a second data element from the first group of data elements is read from a second memory location, whereby the first group of data elements is read out of the memory in the second block order.

2. The apparatus of claim 1 wherein the data elements are arranged in m groups of data elements, wherein the m groups of data elements include the first and second group of data elements, wherein each of the first and second groups of data elements includes D data elements, and wherein the address generator generates a sequence of addresses given by the following equation:

$$M_i(n) = 0 \quad \text{for } n = 0$$

$$M_i(n) = (M_i(n-1) + R^i) \bmod(mD-1) \quad \text{for } n = 0, 1, 2 \ldots mD-1$$

wherein i varies from 0 to L−1, wherein R=D, and wherein L satisfies the following equation:

$$(R^L) \bmod(mD-1) = 1.$$

3. The apparatus of claim 1 wherein each of the first and second groups of data elements includes D data elements, and wherein the address generator comprises:

address counting means for counting from 0 to D−1 and for providing a corresponding output count from 0 to D−1; and, combining means for combining the output count with an offset so as to generate the addresses, the offset being zero in a first segment of the data elements, the offset being zero in a first group of a second segment of the data elements, the offset being eight in a second group of the second segment of the data elements, the offset being four in a third group of the second segment of the data elements, the offset being zero in remaining groups of the second segment of the data elements, the offset being zero in a first group of a third segment of the data elements, the offset being eight in a second group of the third segment of the data elements, the offset being four in remaining groups of the third segment of the data elements, the offset being four in a first group of a fourth segment of the data elements, and the offset being zero in remaining groups of the fourth segment of the data elements.

4. The apparatus of claim 1 wherein the address generator is arranged to supply addresses to the memory so as to de-rotate the data elements of the first and second groups of data elements.

5. The apparatus of claim 1 wherein the address generator is arranged to supply addresses to the memory so as to de-interleave the data elements of the first and second groups of data elements.

6. The apparatus of claim 1 wherein the memory is a first memory, wherein the address generator is a first address generator, wherein the apparatus further comprises a second memory and a second address generator, wherein the first address generator substantially alone supplies addresses to the first memory and the second address generator substantially alone supplies addresses to the second memory so that data elements entering the first memory are rotated and interleaved, so that data elements are read out of the first memory as de-rotated and interleaved data elements, so that the de-rotated and interleaved data elements are stored in the second memory, and so that data elements are read out of the second memory as de-rotated and de-interleaved data elements.

7. The apparatus of claim 1 wherein each of the first and second groups of data elements includes D data elements, and wherein the address generator comprises:

address counting means for counting from 0 to D−1, for providing a corresponding output count from 0 to D−1, and for resetting after reaching a count of D−1;

offset generating means for generating an offset;

combining means for combining the offset and the output count so as to generate the addresses, the combining means including modulo D adding means for adding the offset to the output count of the address counting means in a module D operation.

8. The apparatus of claim 7 wherein the data elements are arranged in m groups of data elements, wherein the m groups of data elements include the first and second group of data elements, wherein each group of data elements has D data elements, and wherein the address generator generates a sequence of addresses given by the following equation:

$$M_i(n) = 0 \quad \text{for } n = 0$$

$$M_i(n) = (M_i(n-1) + R^i) \bmod(mD-1) \quad \text{for } n = 0, 1, 2 \ldots mD-1$$

wherein i varies from 0 to L−1, wherein R=D, and wherein L satisfies the following equation:

$$(R^L) \bmod(mD-1)=1.$$

9. The apparatus of claim 1 wherein each of the first and second groups of data elements includes D data elements, arid wherein the memory stores substantially D data elements at a time.

10. The apparatus of claim 9 wherein the data elements in the first and second groups of data elements are rotated as received by the apparatus, and wherein the address generator comprises:

address counting means for counting from 0 to D−1, for providing a corresponding output count from 0 to D−1, and for resetting after reaching a count of D−1;

offset generating means for generating an offset, wherein the offset is dependent upon an extent of rotation of the D data elements; and, combining means for combining the offset and the output count so as to generate the addresses.

11. The apparatus of claim 10 wherein the combining means comprises module D adding means for adding the offset to the output count of the address counting means in a module D operation.

12. The apparatus of claim 10 wherein the offset is further dependent upon the group of D data elements.

13. The apparatus of claim 9 wherein the data elements are rotated as received by the apparatus, wherein the data elements are arranged in S segments, wherein each S segment of data elements is comprised of G groups of data elements, wherein the G groups of data elements include the first and second groups of data elements, and wherein the address generator comprises:

address counting means for counting from 0 to D−1, for providing a corresponding output count from 0 to D−1, and for resetting after reaching a count of D−1; and, offset generating means for generating an offset, wherein the offset is dependent upon the segment of data elements, the group of data elements, and an extent of rotation of the D data elements in a group of data elements; and, combining means for combining the offset and the output count so as to generate the addresses.

14. The apparatus of claim 13 wherein the combining means comprises modulo D adding means for adding the offset to the output count of the address counting means in a modulo D operation.

15. The apparatus of claim 13 wherein the offset generating means generates an offset of zero for a first of the S segments, wherein the offset generating means generates an offset of zero for a first group of a second of the S segments, wherein the offset generating means generates an offset of eight for a second group of the second of the S segments, wherein the offset generating means generates an offset of four for a third group of the second of the S segments, wherein the offset generating means generates an offset of zero for any remaining groups of the second of the S segments, wherein the offset generating means generates an offset of zero for a first group of a third of the S segments, wherein the offset generating means generates an offset of eight for a second group of the third of the S segments, wherein the offset generating means generates an offset of four for any remaining groups of the third of the S segments, wherein the offset generating means generates an offset of four for a first group of a fourth of the S segments, and wherein the offset generating means generates an offset of zero for any remaining groups of the fourth of the S segments.

16. The apparatus of claim 1 wherein the data elements are arranged in m groups of data elements, wherein the m groups of data elements include the first and second group of data elements, wherein each group of data elements has D data elements, wherein the data elements are interleaved according to the first block order, wherein the apparatus is arranged to de-interleave the data elements to the second block order, and wherein the memory stores substantially mD data elements at a time.

17. The apparatus of claim 16 wherein the address generator comprises:

counting means for counting from 0 to mD−1, for providing an output count when reaching a count of mD−1, and for resetting after providing the output count;

seed generating means responsive to the output count for generating a seed; and, converting means for converting the output count and the seed to a sequence of addresses.

18. The apparatus of claim 17 wherein the converting means comprises:

adding means for adding the seed to a modulo mD−1 output in order to produce an output;

a modulo mD−1 converter arranged to convert the output of the adding means to the modulo mD−1 output on the basis of a modulo mD−1 operation; and, means for connecting the modulo mD−1 output to the adding means and the memory.

19. The apparatus of claim 17 wherein the seed generating means is arranged to generate L seeds, wherein L is given by the following equation:

$$(R^L) \bmod(mD-1)=1$$

wherein L is 0, 1, 2, . . . until the seeds begin repeating at $L_{max}$, wherein R=D, wherein the address sequences are given by the following equation:

$$M_i(n) = 0 \quad \text{for } n = 0$$

$$M_i(n) = (M_i(n-1) + R^i) \bmod(mD-1) \quad \text{for } n = 0, 1, 2 \ldots mD-1$$

wherein i varies from 0 to $L_{max}-1$.

20. The apparatus of claim 17 wherein the converting means comprises:

multiplying means for multiplying the seed by the output count in order to produce an output;

a modulo mD−1 converter arranged to convert the output of the multiplying means to a modulo mD−1 output on the basis of a modulo mD−1 operation; and, means for connecting the modulo mD−1 output to the memory.

21. The apparatus of claim 1 wherein the memory comprises first and second memories, wherein the address generator comprises first and second address generators, wherein the first address generator is arranged to supply addresses to the first memory so as to de-rotate the data elements, and wherein the second address generator is arranged to supply addresses to the second memory so as to de-interleave the data elements, thus producing the second block order.

22. The apparatus of claim 21 wherein the first and second memories and first and second address generators are arranged so that data elements entering the first memory are rotated and interleaved, so that data elements are read out of the first memory as de-rotated and interleaved data elements, so that the de-rotated and interleaved data elements are stored in the second memory, and so that data elements are read out of the second memory as de-rotated and de-interleaved data elements.

23. The apparatus of claim 22 wherein the first memory stores D data elements at a time, wherein the second memory stores mD data elements at a time, and wherein m is an integer.

24. The apparatus of claim 23 wherein the first address generator comprises:

first counting means for counting from 0 to D−1, for providing a corresponding output count from 0 to D−1, and for resetting after reaching a count of D−1;

offset generating means for generating an offset, wherein the offset is dependent upon an extent of rotation of the D data elements; and, first modulo converting means for converting the offset and the corresponding output count of the first counting means to a first sequence of addresses on the basis of a modulo D operation; and, wherein the second address generator comprises:

second counting means for counting from 0 to mD−1, for providing an output count when reaching a count of mD−1, and for resetting after providing the output count;

seed generating means responsive to the output count of the second counting means for generating a seed; and, second modulo converting means for converting the seed to a second sequence of addresses on the basis of a modulo mD−1 operation.

25. The apparatus of claim 24 wherein the data elements are arranged in S data segments, wherein each segment has G groups of data elements, wherein each group has D data elements, wherein the offset generating means generates the offset so that the offset is dependent upon the segment and group of data elements and an extent of rotation of the D data elements in a group of data elements, and wherein the second modulo converting means comprises:

adding means for adding the seed to a modulo mD−1 output in order to produce an output;

a modulo mD−1 converter arranged to convert the output of the adding means to the modulo mD−1 output on the basis of a modulo mD−1 operation; and, means for connecting the modulo mD−1 output to the adding means and to the further memory.

26. The apparatus of claim 25 wherein the offset generating means generates an offset of zero for a first of the S segments, wherein the offset generating means generates an offset of zero for a first group of a second of the S segments, wherein the offset generating means generates an offset of eight for a second group of the second of the S segments, wherein the offset generating means generates an offset of four for a third group of the second of the S segments, wherein the offset generating means generates an offset of zero for any remaining groups of the second of the S segments, wherein the offset generating means generates an offset of zero for a first group of a third of the S segments, wherein the offset generating means generates an offset of eight for a second group of the third of the S segments, wherein the offset generating means generates an offset of four for any remaining groups of the third of the S segments, wherein the offset generating means generates an offset of four for a first group of a fourth of the S segments, and wherein the offset generating means generates an offset of zero for any remaining groups of the fourth of the S segments.

27. The apparatus of claim 26 wherein the seed generating means is arranged to generate L seeds, wherein L is given by the following equation:

$$(R^L) \bmod (mD-1) = 1$$

wherein L is 0, 1, 2, . . . until the seeds begin repeating at $L_{max}$, wherein R=D, wherein the address sequences are given by the following equation:

$$M_i(n) = 0 \qquad \text{for } n = 0$$
$$M_i(n) = (M_i(n-1) + R^i) \bmod (mD-1) \quad \text{for } n = 0, 1, 2 \ldots mD-1$$

wherein i varies from 0 to $L_{max}-1$.

28. An apparatus for reordering block ordered data elements from a first known order to a second desired order, wherein the data elements are arranged in a plurality of data groups, wherein each group has D data elements, the apparatus comprising:

a memory having substantially D memory locations to store a group of data elements; and a single address generator that generates and supplies a repeating series of addresses to the memory so that a previously stored data element is read from one of the memory locations and thereafter a data element may be written to the one memory location prior to reading another previously stored data element from another one of the memory locations and prior to writing a data element to another one of the memory locations.

29. The apparatus of claim 28 wherein the single address generator is arranged to supply addresses to the memory so as to de-rotate the data elements.

30. The apparatus of claim 28 wherein the single address generator is arranged to supply addresses to the memory so as to de-interleave the data elements.

31. The apparatus of claim 28 wherein the memory is a first memory, wherein the data elements are arranged in m groups of data elements, wherein each group of data elements has D data elements, wherein the apparatus further comprises a second memory, wherein the second memory stores mD data elements at a time, and wherein the address generator comprises:

counting means for counting from 0 to mD−1, for providing an output count when reaching a count of mD−1, and for resetting after providing the output count;

seed generating means responsive to the output count for generating a seed; and, converting means for converting the seed to a sequence of addresses.

32. The apparatus of claim 28 wherein the single address generator comprises:

address counting means for counting from 0 to D−1 and for providing a corresponding output count from 0 to D−1; and, combining means for combining the output count with an offset so as to generate the addresses, the offset being zero in a first segment of the data elements, the offset being zero in a first group of a second segment of the data elements, the offset being eight in a second group of the second segment of the data elements, the offset being four in a third group of the second segment of the data elements, the offset being zero in remaining groups of the second segment of the data elements, the offset being zero in a first group of a third segment of the data elements, the offset being eight in a second group of the third segment of the data elements, the offset being four in remaining groups of the third segment of the data elements, the offset being four in a first group of a fourth segment of the data elements, and the offset being zero in remaining groups of the fourth segment of the data elements.

33. The apparatus of claim 28 wherein the data elements are arranged in m groups of data elements, wherein the m groups of data elements include the first and second group of data elements, and wherein the single address generator generates a sequence of addresses given by the following equation:

$$M_i(n) = 0 \quad \text{for } n = 0$$
$$M_i(n) = (M_i(n-1) + R^i) mod(mD - 1) \quad \text{for } n = 0, 1, 2 \ldots mD - 1$$

wherein i varies from 0 to L−1, wherein R=D, and wherein L satisfies the following equation:

$$(R^L)\mod(mD-1)=1.$$

34. The apparatus of claim 28 wherein the memory is a first memory, wherein the single address generator is a single first address generator, wherein the apparatus further comprises a second memory and a single second address generator, wherein the single first address generator substantially alone supplies addresses to the first memory and the single second address generator substantially alone supplies addresses to the second memory so that data elements entering the first memory are rotated and interleaved, so that data elements are read out of the first memory as de-rotated and interleaved data elements, so that the de-rotated and interleaved data elements are stored in the second memory, and so that data elements are read out of the second memory as de-rotated and de-interleaved data elements.

35. The apparatus of claim 34 wherein the first memory stores D data elements at a time, wherein the second memory stores mD data elements at a time, and wherein m is an integer.

36. The apparatus of claim 28 wherein the single address generator comprises;
   address counting means for counting from 0 to D−1, for providing a corresponding output count from 0 to D−1, and for resetting after reaching a count of D−1;
   offset generating means for generating an offset, wherein the offset is dependent upon an extent of rotation of the D data elements; and,
   combining means for combining the offset and the output count so as to generate the addresses.

37. The apparatus of claim 36 wherein the offset is further dependent upon the group of D data elements.

38. A method for reordering block ordered data elements from a first order to a second order, the method comprising the following steps:
   a) repeatedly generating a sequence of addresses for addressing memory locations of a memory;
   b) reading a stored data element from one of the memory locations addressed by one of the addresses of the sequence of addresses; and,
   c) writing a data element to the one memory location before reading a stored data element from another of the memory locations addressed by another of the addresses of the sequence of addresses.

39. The method of claim 38 wherein steps a), b), and c) are arranged to de-rotate the data elements.

40. The method of claim 38 wherein the data elements are arranged in m groups of data elements, wherein each group includes D data elements, and wherein step a) generates a sequence of addresses given by the following equation:

$$M_i(n) = 0 \quad \text{for } n = 0$$
$$M_i(n) = (M_i(n-1) + R^i) mod(mD - 1) \quad \text{for } n = 0, 1, 2 \ldots mD - 1$$

wherein i varies from 0 to L−1, wherein R=D, and wherein L satisfies the following equation:

$$(R^L)\mod(mD-1)=1.$$

41. The method of claim 38 wherein the data elements are arranged in groups, wherein each group includes D data elements, and wherein step a) comprises the following steps:
   a1) counting from 0 to D−1 to provide a count; and,
   a2) combining the count with an offset so as to generate the addresses, the offset being zero in a first segment of the data elements, the offset being zero in a first group of a second segment of the data elements, the offset being eight in a second group of the second segment of the data elements, the offset being four in a third group of the second segment of the data elements, the offset being zero in remaining groups of the second segment of the data elements, the offset being zero in a first group of a third segment of the data elements, the offset being eight in a second group of the third segment of the data elements, the offset being four in remaining groups of the third segment of the data elements, the offset being four in a first group of a fourth segment of the data elements, and the offset being zero in remaining groups of the fourth segment of the data elements.

42. The method of claim 38 wherein steps a), b), and c) are arranged to de-interleave the data elements.

43. The method of claim 42 wherein steps a), b), and c) are arranged to de-rotate and de-interleave the data elements.

44. The method of claim 38 wherein the data elements are arranged in groups, wherein each group includes D data elements, and wherein step a) comprises the following steps:
   a1) counting from 0 to D−1 to provide a count;
   a2) generating an offset; and,
   a3) adding the offset to the count of the address counting means in a modulo D operation.

45. The method of claim 44 wherein the data elements are arranged in m groups of data elements, and wherein step a) generates a sequence of addresses given by the following equation:

$$M_i(n) = 0 \quad \text{for } n = 0$$
$$M_i(n) = (M_i(n-1) + R^i) mod(mD - 1) \quad \text{for } n = 0, 1, 2 \ldots mD - 1$$

wherein i varies from 0 to L−1, wherein R=D, and wherein L satisfies the following equation:

$$(R^L)\mod(mD-1)=1.$$

* * * * *